(12) United States Patent
Zhao et al.

(10) Patent No.: US 12,107,392 B2
(45) Date of Patent: Oct. 1, 2024

(54) WAVELENGTH TUNABLE LASER

(71) Applicant: HUAWEI TECHNOLOGIES CO., LTD., Guangdong (CN)

(72) Inventors: Jialin Zhao, Wuhan (CN); Wei Chen, Shenzhen (CN); Xiaolu Song, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 972 days.

(21) Appl. No.: 17/063,917

(22) Filed: Oct. 6, 2020

(65) Prior Publication Data

US 2021/0021102 A1    Jan. 21, 2021

Related U.S. Application Data

(63) Continuation of application No. PCT/CN2018/082405, filed on Apr. 9, 2018.

(51) Int. Cl.
*H01S 5/14* (2006.01)
*H01S 5/02* (2006.01)
(Continued)

(52) U.S. Cl.
CPC .............. *H01S 5/142* (2013.01); *H01S 5/026* (2013.01); *H01S 5/1028* (2013.01);
(Continued)

(58) Field of Classification Search
CPC ........... H01S 5/142; H01S 5/026–0268; H01S 5/021; H01S 5/0264; H01S 5/1028;
(Continued)

(56) References Cited

U.S. PATENT DOCUMENTS 7,565,045 B2 *   7/2009   Suzuki .................... H01S 5/141
                                                              385/27
9,608,406 B1 *   3/2017   Lee ........................ H01S 5/0612
(Continued)

FOREIGN PATENT DOCUMENTS

CN        204315907 U     5/2015
CN        106785906 A     5/2017
(Continued)

OTHER PUBLICATIONS

Extended European Search Report issued in European Application No. 18914617.8 on Feb. 18, 2021, 8 pages.
(Continued)

*Primary Examiner* — Joshua King
(74) *Attorney, Agent, or Firm* — Fish & Richardson P.C.

(57) ABSTRACT

Example wavelength tunable lasers are described. One example wavelength tunable laser includes a reflective semiconductor optical amplifier, three couplers, and at least two microring resonators. The reflective semiconductor optical amplifier is connected to one port of the first coupler. Some of the at least two microring resonators are arranged between another port of the first coupler and one port of the second coupler, the others of the at least two microring resonators are arranged between a third port of the first coupler and a second port of the second coupler, and a third port and a fourth port of the second coupler are connected to two ports of the third coupler.

17 Claims, 8 Drawing Sheets

(51) Int. Cl.
    *H01S 5/02325*     (2021.01)
    *H01S 5/026*     (2006.01)
    *H01S 5/0687*     (2006.01)
    *H01S 5/10*     (2021.01)
    *H01S 5/50*     (2006.01)

(52) U.S. Cl.
    CPC .............. *H01S 5/1032* (2013.01); *H01S 5/50* (2013.01); *H01S 5/021* (2013.01); *H01S 5/02325* (2021.01); *H01S 5/0261* (2013.01); *H01S 5/0687* (2013.01)

(58) Field of Classification Search
    CPC .......... H01S 5/1032; G02B 6/122–125; G02B 6/12007–12033
    See application file for complete search history.

(56) References Cited

U.S. PATENT DOCUMENTS

| | | | |
|---|---|---|---|
| 9,812,845 B1 | 11/2017 | Lee et al. | |
| 10,530,126 B2 * | 1/2020 | Ma | H01S 3/083 |
| 2004/0096155 A1 * | 5/2004 | Singh | G02B 6/42 |
| | | | 385/37 |
| 2004/0125846 A1 | 7/2004 | Zediker et al. | |
| 2004/0258360 A1 * | 12/2004 | Lim | H01S 5/141 |
| | | | 385/28 |
| 2005/0025199 A1 * | 2/2005 | Ma | H01S 5/141 |
| | | | 372/20 |
| 2005/0058396 A1 * | 3/2005 | Tormen | G02F 1/3132 |
| | | | 385/27 |
| 2006/0127007 A1 * | 6/2006 | Margalit | H01S 5/141 |
| | | | 385/39 |
| 2006/0198401 A1 * | 9/2006 | Suzuki | H01S 5/142 |
| | | | 372/29.016 |
| 2008/0056311 A1 * | 3/2008 | Takeuchi | H01S 5/141 |
| | | | 372/20 |
| 2008/0232409 A1 * | 9/2008 | Yamazaki | G02B 6/12004 |
| | | | 372/20 |
| 2009/0122817 A1 * | 5/2009 | Sato | G02B 6/12007 |
| | | | 372/20 |
| 2009/0274187 A1 * | 11/2009 | Kudo | H01S 5/026 |
| | | | 372/50.1 |
| 2009/0285251 A1 * | 11/2009 | Yamazaki | H01S 5/141 |
| | | | 372/29.014 |
| 2012/0195332 A1 * | 8/2012 | Yoffe | H01S 5/1032 |
| | | | 372/98 |
| 2012/0281723 A1 * | 11/2012 | Oh | H01S 5/141 |
| | | | 372/20 |
| 2015/0215043 A1 * | 7/2015 | Debregeas | H04J 14/02 |
| | | | 398/79 |
| 2015/0288148 A1 * | 10/2015 | Takabayashi | H01S 3/06791 |
| | | | 372/6 |
| 2016/0156149 A1 * | 6/2016 | Takabayashi | H01S 5/142 |
| | | | 372/6 |
| 2017/0139237 A1 * | 5/2017 | Luo | H01S 5/50 |
| 2017/0141536 A1 * | 5/2017 | Fang | H01S 5/026 |
| 2017/0293085 A1 * | 10/2017 | Matsuda | G02B 6/34 |
| 2019/0027899 A1 * | 1/2019 | Krishnamoorthy | H01S 5/021 |
| 2019/0058306 A1 * | 2/2019 | Wen | H01S 5/142 |
| 2019/0324198 A1 * | 10/2019 | Oldenbeuving | G02B 6/29355 |

FOREIGN PATENT DOCUMENTS

| | | | | |
|---|---|---|---|---|
| CN | 109818258 A | * | 5/2019 | ......... G02B 6/12007 |
| EP | 1975657 A2 | * | 10/2008 | ......... G02B 6/12007 |
| EP | 2597736 A1 | * | 5/2013 | ......... G02B 6/12007 |
| JP | 2010087472 A | | 4/2010 | |
| JP | 2010177539 A | * | 8/2010 | |
| JP | 2012212002 A | * | 11/2012 | |
| JP | 2013182894 A | * | 9/2013 | |
| JP | 5609135 B2 | * | 10/2014 | |
| JP | 2016213379 A | * | 12/2016 | .......... H01S 5/0078 |
| JP | 2017015789 A | | 1/2017 | |
| JP | 2017098362 A | * | 6/2017 | |
| JP | 2017175009 A | | 9/2017 | |
| WO | WO-2007029647 A1 | * | 3/2007 | ......... G02B 6/12007 |
| WO | 2011108617 A1 | | 9/2011 | |

OTHER PUBLICATIONS

Office Action issued in Chinese Application No. 201880090852.0 on Jun. 2, 2021, 15 pages (with English translation).
Office Action issued in Japanese Application No. 2020-555152 on Dec. 13, 2021, 12 pages (with English translation).
Kawamura et al., "Si-SOA Hybrid Wavelength Tunable Laser with a Tunable Coupler for High-Power Operation," 2015 Conference on Lasers and Electro-Optics (CLEO), May 2015, 2 pages.
PCT International Search Report and Written Opinion issued in International Application No. PCT/CN2018/082405 on Dec. 14, 2018, 19 pages (with English translation).
Zhao et al, "Narrow-linewidth widely tunable hybrid external cavity laser using Si3N4/SiO2 microring resonators," 2016 IEEE 13th International Conference on Group IV Photonics (GFP), Aug. 2016, 2 pages.

* cited by examiner

WAVELENGTH TUNABLE LASER

CROSS-REFERENCE TO RELATED APPLICATIONS

This application is a continuation of International Patent Application No. PCT/CN2018/082405, Filed on Apr. 9, 2018. The disclosure of the aforementioned application is hereby incorporated by reference in its entirety.

TECHNICAL FIELD

This application relates to the field of optical devices, and in particular, to a laser.

BACKGROUND

A wavelength tunable laser is one of the most important optoelectronic devices in an optical communications system. At present, the wavelength tunable laser has been widely used in devices in backbone and metropolitan area optical networks. Most widely used wavelength tunable lasers include a monolithically integrated distributed Bragg reflector (DBR) laser based on a III-V material system, a distributed feedback Bragg (DFB) laser array, and an external cavity laser based on spatial optical coupling. Limited by a material loss and a cavity length of a laser, typical linewidth values of DBR and DFB lasers used in a current 100 Gbps quadrature phase shift keying (QPSK) system are less than 300 kHz. Therefore, it is difficult for these lasers to meet a requirement of a higher order coherent modulation system (for example, quadrature amplitude modulation (QAM)) for a narrow linewidth, for example, a linewidth of less than 100 kHz. In addition, although an external cavity tunable laser has an extremely narrow linewidth, it is not easy to integrate the external cavity tunable laser with devices such as a modulator and a receiver. Therefore, this is not conducive to development of miniaturization of an optical module.

At present, a research focus of a narrow linewidth tunable laser used in a higher order coherent system is a tunable laser based on a hybrid integration technology. FIG. 1 is a schematic structural diagram of a wavelength tunable laser in the prior art. As shown in FIG. 1, the wavelength tunable laser includes a semiconductor optical amplifier 101, a first multi-mode interferometer coupler 102, a second multi-mode interferometer coupler 105, two microring resonators (103a and 103b), and an asymmetric Mach-Zehnder interferometer (MZI) 104. The semiconductor optical amplifier 101 is configured to generate spontaneous emission light and amplify an optical signal. The first multi-mode interferometer coupler 102, the second multi-mode interferometer coupler 105, and the two microring resonators (103a and 103b) form a filter. The filter is used to perform filtering and wavelength tuning (that is, selection) on the spontaneous emission light. The wavelength tunable laser can adjust optical power of an output port 106 by using the MZI 104. However, when an optical signal enters the second multi-mode interferometer coupler 105 from the microring resonator 103b, there is some energy loss (for example, 3 dB). Therefore, this extra loss will cause output efficiency of the laser to decrease.

SUMMARY

Embodiments of this application provide a wavelength tunable laser, to improve output efficiency.

According to a first aspect, an embodiment of this application provides a wavelength tunable laser. The wavelength tunable laser includes: a reflective semiconductor optical amplifier, three couplers, and at least two microring resonators. The three couplers include a first coupler, a second coupler, and a third coupler, and the three couplers include three ports, four ports, and three ports, respectively. A connection relationship between these components is as follows: The reflective semiconductor optical amplifier is connected to a first port of the first coupler, some of the at least two microring resonators are arranged between a second port of the first coupler and a first port of the second coupler, the others of the at least two microring resonators are arranged between a third port of the first coupler and a second port of the second coupler, and a third port and a fourth port of the second coupler are connected to two ports of the third coupler.

In a specific design, coupling coefficients of the first coupler and the third coupler are the same, to improve output efficiency of the optical signal of the third coupler to the greatest extent.

The at least two microring resonators may be specifically two resonators, or more than two microring resonators (for example, four microring resonators).

In a possible implementation, that some of the at least two microring resonators are arranged between a second port of the first coupler and a first port of the second coupler, and the others of the at least two microring resonators are arranged between a third port of the first coupler and a second port of the second coupler specifically includes the following: the at least two microring resonators include a first microring resonator and a second microring resonator; the second port of the first coupler is connected to one waveguide of the first microring resonator, and the first port of the second coupler is connected to another waveguide of the first microring resonator; and the third port of the first coupler is connected to one waveguide of the second microring resonator, and the second port of the second coupler is connected to another waveguide of the second microring resonator.

In a specific design, any one of the first microring resonator and the second microring resonator includes one or more microrings.

In another possible implementation, that some of the at least two microring resonators are arranged between a second port of the first coupler and a first port of the second coupler, and the others of the at least two microring resonators are arranged between a third port of the first coupler and a second port of the second coupler specifically includes the following: the at least two microring resonators include a first microring resonator, a second microring resonator, a third microring resonator, and a fourth microring resonator; the second port of the first coupler is connected to one waveguide of the first microring resonator, and the first port of the second coupler is connected to one waveguide of the second microring resonator; and the third port of the first coupler is connected to one waveguide of the third microring resonator, and the second port of the second coupler is connected to one waveguide of the fourth microring resonator.

In a possible design, the first microring resonator is connected to the second microring resonator, and the third microring resonator is connected to the fourth microring resonator.

In another possible design, one or more microring resonators are arranged between the first microring resonator and the second microring resonator or between the third microring resonator and the fourth microring resonator.

In a possible design, any one of the first microring resonator, the second microring resonator, the third microring resonator, and the fourth microring resonator includes one or more microrings.

In a possible design, an end face in which the reflective semiconductor optical amplifier is connected to the first coupler is plated with an antireflective coating, and the other end face of the reflective semiconductor optical amplifier is plated with a highly reflective coating. An advantage of doing this is that optical signal output power can be increased.

In a possible design, another port of the third coupler is connected to another semiconductor optical amplifier. In this way, an optical signal outputted from the third coupler may be further amplified, to increase the optical signal output power of the laser.

In a possible design, both end faces of the another semiconductor optical amplifier are plated with antireflective coatings.

In a possible design, the at least two microring resonators are connected to a plurality of photodetectors, and the photodetectors are configured to obtain optical power information of a microring, to implement alignment between a target wavelength outputted by the wavelength tunable laser and a resonance wavelength of the microring.

In a possible design, the wavelength tunable laser further includes a refractive index tuning unit, and the at least two microring resonators each are provided with another refractive index tuning unit. Specifically, an adjustment manner of the refractive index tuning unit and the another refractive index tuning unit is any one of thermal adjustment, carrier injection adjustment, or piezo-optic effect adjustment.

It should be noted that the three couplers, the at least two microring resonators, and the output waveguide includes any one of the following four materials: silicon, silicon nitride, silicon dioxide, and a polymer material. Both the first coupler and the third coupler are of a Y-shaped structure or a multi-mode interferometer structure, and the second coupler is of a directional coupler structure or a multi-mode interferometer structure.

According to a second aspect, an embodiment of this application provides a system. The system includes a wavelength tunable laser and a control circuit according to any one of implementations of the first aspect. The control circuit implements wavelength control on the wavelength tunable laser.

According to the wavelength tunable laser or the system including the wavelength tunable laser provided in this application, by using a clever design of a filter region and an output structure, an optical signal outputted by the filter region can be effectively aggregated and outputted. The structure is simple, and the output efficiency the optical signals can be improved.

BRIEF DESCRIPTION OF DRAWINGS

The following describes in more details the embodiments of this application with reference to the accompanying drawings.

DESCRIPTION OF EMBODIMENTS

A wavelength tunable laser is a laser whose output wavelength can be changed within a specific wavelength range. The wavelength tunable laser has wide applications in fields such as medicine, semiconductor material processing, and optical communication systems. For example, when applied to an optical communications system, the wavelength tunable laser is usually a part of an optical communications device, and is configured to send or receive an optical signal. There are many types of wavelength tunable lasers. For example, there are a monolithically integrated DBR laser based on a III-V material system, a DFB laser array, an external cavity laser based on spatial optical coupling, a laser based on a hybrid integration technology, and the like. A laser includes a gain region and a wavelength tuning region. The hybrid integration technology refers to a technology for fabrication of a tunable laser in which a III-V material is used for a gain region, and another passive and low-loss material that can be used to fabricate a photonic integrated circuit (PIC) is used for a wavelength tuning region. This application mainly discusses the laser based on the hybrid integration technology. The wavelength tuning region is sometimes referred to as a filter region. For brevity, the wavelength tuning region is uniformly referred to as a filter region below.

Figure 1:
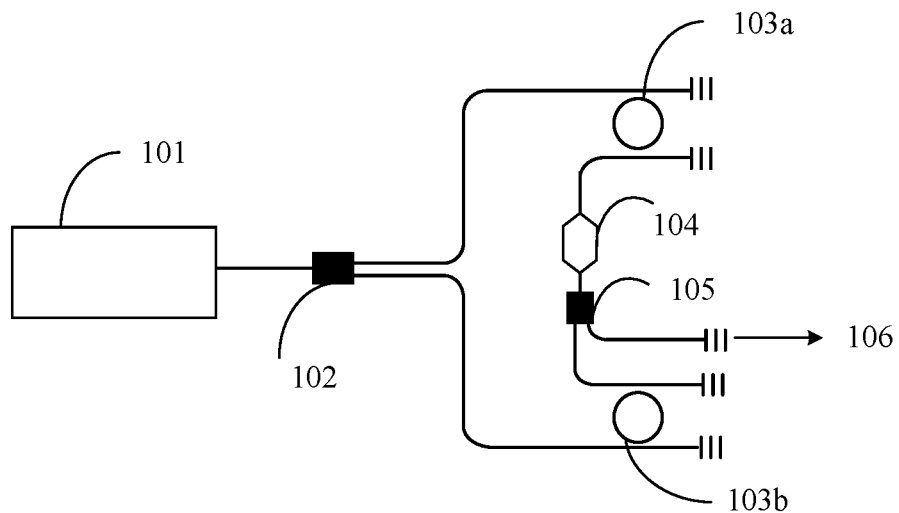
FIG. 1 is a schematic structural diagram of a wavelength tunable laser in the prior art.
Figure 2:
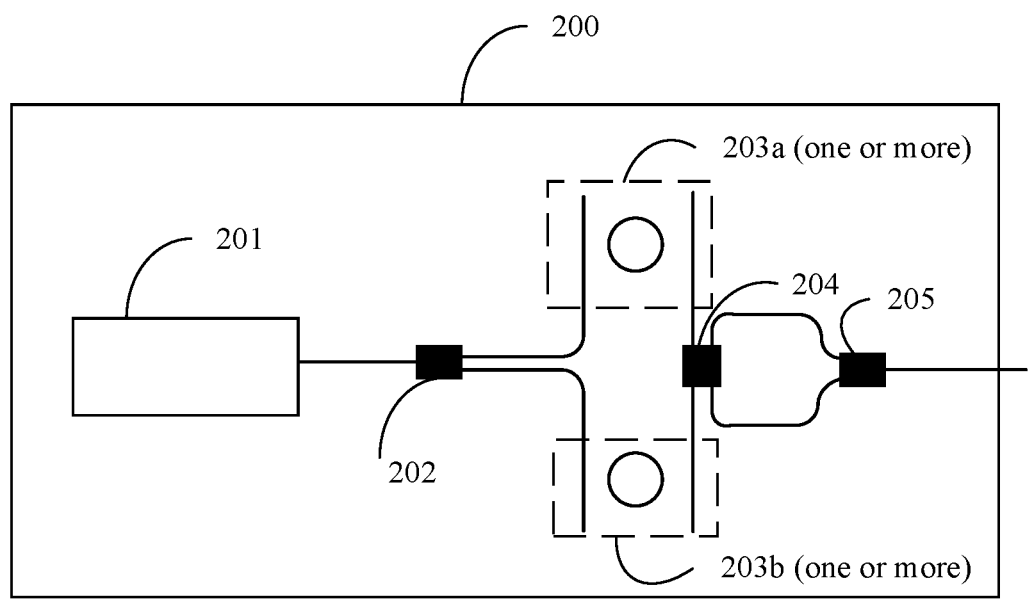
FIG. 2 is a schematic structural diagram of a wavelength tunable laser according to this application.

FIG. 2 is a schematic structural diagram of a wavelength tunable laser according to this application. The wavelength tunable laser 200 shown in FIG. 2 includes a reflective semiconductor optical amplifier (SOA) 201, three couplers (202, 204, and 205), and at least two microring resonators (203a and 203b). The coupler 202 includes three ports, the coupler 204 includes four ports, and the coupler 205 includes three ports. FIG. 2 shows a relationship between these components. Specifically, one port of the coupler 202 is connected to the reflective SOA 201. The other two ports of the coupler 202 are connected to one port of the microring resonator 203a and one port of the microring resonator 203b. The other port of the microring resonator 203a and the other port of the microring resonator 203b are connected to two ports of the coupler 204. The other two ports of the coupler 204 are connected to two ports of the coupler 205. Another port of the coupler 205 is configured to output laser light. It should be noted that the reflective SOA is an SOA of which one end face can reflect an optical signal, and the three couplers and the two microring resonators are made of passive waveguide materials. In addition, the coupler 202 and the reflective SOA 201 may be connected in a coupling manner commonly used by a person skilled in the art, such as butt coupling or grating coupling. The couplers 202 and 205, and the microring resonators are directly connected by using a waveguide. It should be further noted that the foregoing quantities of ports of the couplers are merely a limitation on minimum quantities of ports. In actual use, the foregoing three couplers may be implemented by using more ports. This is not limited in this application.

The components of the laser shown in FIG. 2 may be divided into two main functional parts. The reflective SOA 201 forms a gain region, and is configured to generate spontaneous emission light and amplify an optical signal. The coupler 202, the at least two microring resonators (203a and 203b), and the coupler 204 form a filter region, and are configured to filter an optical signal input into the filter region, to obtain laser outputs of different wavelengths. In addition, the coupler 204 outputs an optical signal of a specified wavelength to the coupler 205 by using a port connected to the coupler 205. It should be noted that the gain region and the filter region cooperate to process the optical signal for a plurality of times, and finally output laser light. In other words, the gain region generates the spontaneous emission light and amplifies the optical signal, and the filter region filters the optical signal and inputs the optical signal to the gain region for amplification. The generated laser light is outputted through a right component (that is, a right port of the coupler 205 in FIG. 2) of the filter region. In actual application, the generated laser light may alternatively be outputted through a left end face of the reflective SOA 201. That the laser disclosed in this application outputs the laser light through the filter region instead of the reflective SOA 201 brings an advantage that when the laser light is outputted through the passive waveguide material, other functional components based on the material, such as a modulator and a coherent receiver, can be better integrated, to improve coupling efficiency.

It should be noted that the microring resonators 203a and 203b shown in FIG. 2 illustrate a structure of a single microring resonator. For example, the microring resonator 203a includes a ring waveguide and two parallel waveguides on two sides of the ring waveguide. The waveguides on the two sides of the microring resonator (MRR) are also referred to as bus waveguides. In actual application, the ring waveguide may be in another shape, for example, a racetrack shape or a rounded square. In addition, the microring resonators 203a and 203b may be a structure such as a row of ring waveguides arranged between two straight waveguides (referred to as a multi-microring resonator below), or a plurality of cascaded single microring resonators. For details, refer to descriptions related to FIG. 7a to FIG. 7b. Details are not described herein again. A specific structure of the microring resonator is not limited in this application, provided that the microring resonator supports a filter function. It should be noted that, a person skilled in the art may know that, to implement a relatively wide wavelength tuning range, at least two of the plurality of microring resonators in this application have different free spectral ranges (FSR). It should be further noted that regardless of structures and a specific quantity of the microring resonators, the microring resonators in the wavelength tunable laser in this application may be simply divided into two parts two groups). One part of the microring resonators are arranged between two ports of two couplers (that is, between one port of one coupler and one port of another coupler), and the other part of the microring resonators are arranged between the other two ports of the two couplers. Usually, the two groups of microring resonators are the same in type and in quantity. An advantage of doing this is that optical signal coupling and outputting efficiency can be increased. For example, the two groups of microring resonators each are one single microring resonator. For another example, the two groups of microring resonators each include N single microring resonators. It should be noted that radii of microrings in the two groups of microring resonators may not be the same.

The following further describes the embodiments of this application in detail based on the foregoing common aspects of a wavelength alignment technology in this application and with reference to more accompanying drawings. It should be noted that the terms "first," "second," and the like in the following embodiments of this application are used to distinguish similar objects, and do not need to be used to describe a specific order or a sequence. It should be understood that data used in such a way are interchangeable in proper circumstances, so that the embodiments described herein can be implemented in an order not described in this application. It should be further noted that, unless otherwise specified, specific descriptions for some technical features in one embodiment may further be used to explain corresponding technical features mentioned in other embodiments. For example, an example of specific components of a coupler in an embodiment may be applicable to descriptions about a coupler in all other embodiments. In addition, to more clearly reflect a relationship between components in different embodiments, in this application, a same reference numeral is used to represent components with same or similar functions in different embodiments.

Figure 3:
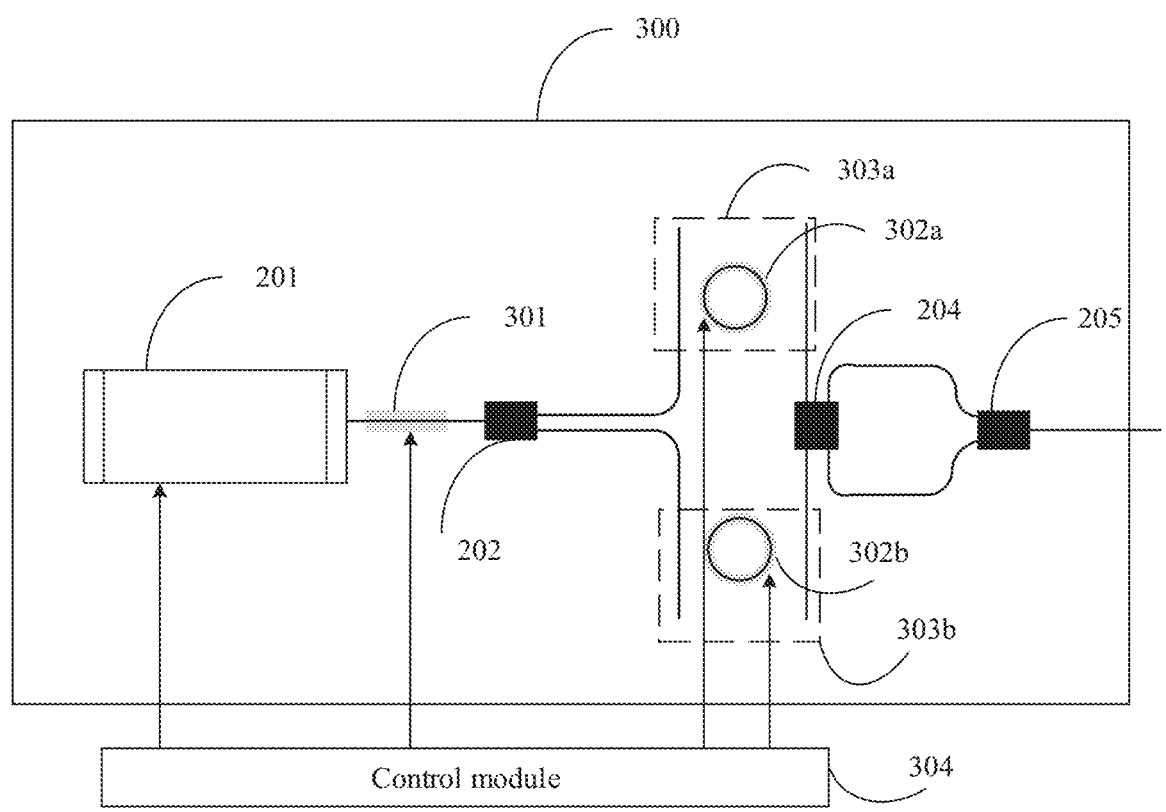
FIG. 3 is a schematic structural diagram of a wavelength tunable laser according to a first embodiment of this application.

FIG. 3 is a schematic structural diagram of a wavelength tunable laser 300 according to a first embodiment of this application. The wavelength tunable laser 300 shown in FIG. 3 includes a reflective SOA 201, three couplers (202, 204, and 205), and two microring resonators (303a and 303b). For functions and connection relationships of these components, refer to descriptions of related components in FIG. 2. Details are not described herein again. It should be noted that, different from FIG. 2 in which the structure of the microring resonator is not limited, in this embodiment, one single microring resonator (that is, 303a) is arranged between one port of the coupler 202 and one port of the coupler 204, and one single microring resonator (that is, 303b) is also disposed between the other port of the coupler 202 and the other port of the coupler 204. In addition, the wavelength tunable laser 300 in this embodiment further includes a first refractive index tuning unit 301, a second refractive index tuning unit 302a, and a third refractive index tuning unit 302b. The first refractive index tuning unit 301 may also be referred to as a phase adjustment region, and the region may be adjusted by using an external control module 304, to change a phase of an optical signal that passes through the unit. The second refractive index tuning unit 302a and the third refractive index tuning unit 302b may also be referred to as a first wavelength tuning region and a second wavelength tuning region. The control module 304 may adjust the two regions, to control a resonance wavelength of a corresponding microring resonator, so that an optical signal of a specific wavelength can be outputted to a predetermined output port through the microring. Specifically, the foregoing adjustment may be performed in any one of the following manners: thermal adjustment, carrier injection adjustment, and piezo-optic effect adjustment. It should be noted that specific adjustment manners of the foregoing three tuning units may be the same or different. This is not limited in this application. In a specific implementation, a same adjustment manner may be used to adjust the three tuning units, to reduce fabrication and control complexity. It should be noted that the phase adjustment region shown in FIG. 3 is merely an example. In specific implementation, the region may be arranged in any position other than the microring in the filter region. It should be further noted that the control module 304 is configured to implement wavelength adjustment on the wavelength tunable laser, to output laser light having a specific wavelength. A person skilled in the art may know that the module usually includes devices such as a processor, a digital-to-analog converter, an analog-to-digital converter, and a memory. In addition, the module is connected to a tuning unit of the wavelength tunable laser 300 by using a circuit. Optionally, the control module 304 may also be used as a part of the wavelength tunable laser 300, to form a whole. For brevity, the refractive index tuning unit is briefly referred to as a tuning unit or a function name (that is, a phase adjustment region and a wavelength tuning region) in subsequent embodiments.

Optionally, in FIG. 3, a left end face of the reflective SOA 201 is plated with a highly reflective coating, and a right end face of the reflective SOA 201 is plated with an antireflective coating. An advantage of doing this is that more optical signals can enter the filter region, to improve output efficiency of a finally output optical signal.

Specifically, specific materials of the three couplers and the two microring resonators in this embodiment may be any one of the following materials: silicon, silicon nitride, silicon dioxide, and a polymer material. A person skilled in the art may know that, with the development of material technologies, a new material developed in the future or a material that is currently being researched but has not been put into commercial use may also be used to fabricate the foregoing components.

Specifically, both the coupler 202 and the coupler 205 may be of a Y-shaped structure or a multi-mode interferometer structure. The coupler 204 may be of a directional coupler structure or a multi-mode interferometer (MMI) structure. In addition, to improve output efficiency as much as possible, coupling coefficients of the coupler 202 and the coupler 205 are set to be the same or similar. For example, coupling coefficients of the coupler 202 and the coupler 205 may be set to 3 dB (that is, 50%:50%). A coupling coefficient of the coupler 204 may be designed based on an output efficiency requirement of the laser. In actual application, the coupling coefficient of the coupler 204 may be further set with reference to another system design requirement (for example, a threshold current or output power of the laser). This is not specifically limited in this application.

According to the structure of the wavelength tunable laser provided in this embodiment, with a symmetric design (for example, the coupler 202 and the coupler 205), optical signals outputted by the filter region can be effectively aggregated and outputted. The structure is simple, and output efficiency of the optical signals can be improved.

Figure 4:
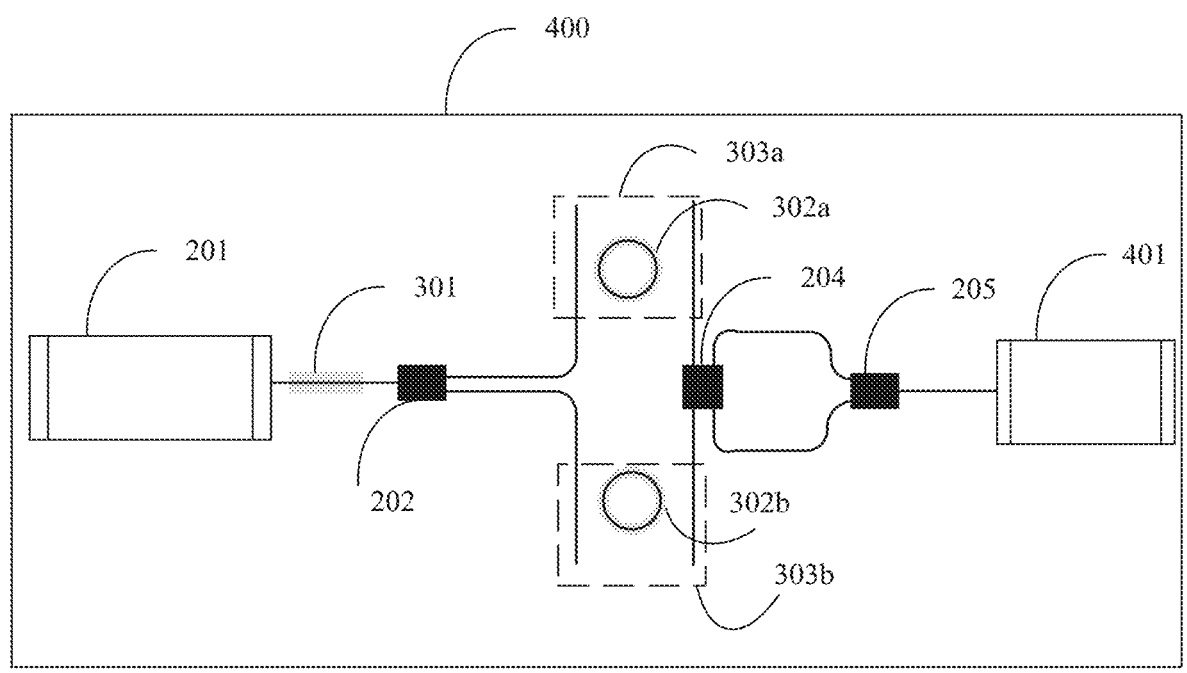
FIG. 4 is a schematic structural diagram of a wavelength tunable laser according to a second embodiment of this application.

FIG. 4 is a schematic structural diagram of a wavelength tunable laser 400 according to a second embodiment of this application. The wavelength tunable laser 400 shown in FIG. 4 includes a reflective SOA 201, three couplers (202, 204, and 205), two microring resonators (303a and 303b), three tuning units (301, 302a, and 302b), and another SOA 401. Functions and location relationships of the reflective SOA 201, the three couplers (202, 204, and 205), the two microring resonators (303a and 303b), and the three tuning regions (301, 302a, and 302b) have been described in FIG. 2 and FIG. 3, and details are not described herein again. Different from the structure of the wavelength tunable laser provided in the first embodiment, in the wavelength tunable laser 400 provided in this embodiment, the another SOA 401 is further connected to an output port of the coupler 205. A function of the amplifier is to further amplify the optical signal output from the coupler 205, to improve output power of the optical signal. Optionally, either of two end faces of the SOA 401 may be plated with an antireflective coating, to reduce impact of light reflected from the end face of the SOA 401 on stability of the laser.

According to the structure of the wavelength tunable laser provided in this embodiment, with a symmetric design, optical signals outputted by the filter region can be effectively aggregated and outputted. The structure is simple, and output efficiency of the optical signals can be improved. In addition, the output power of the optical signal may be further increased by using the SOA.

Figure 5:
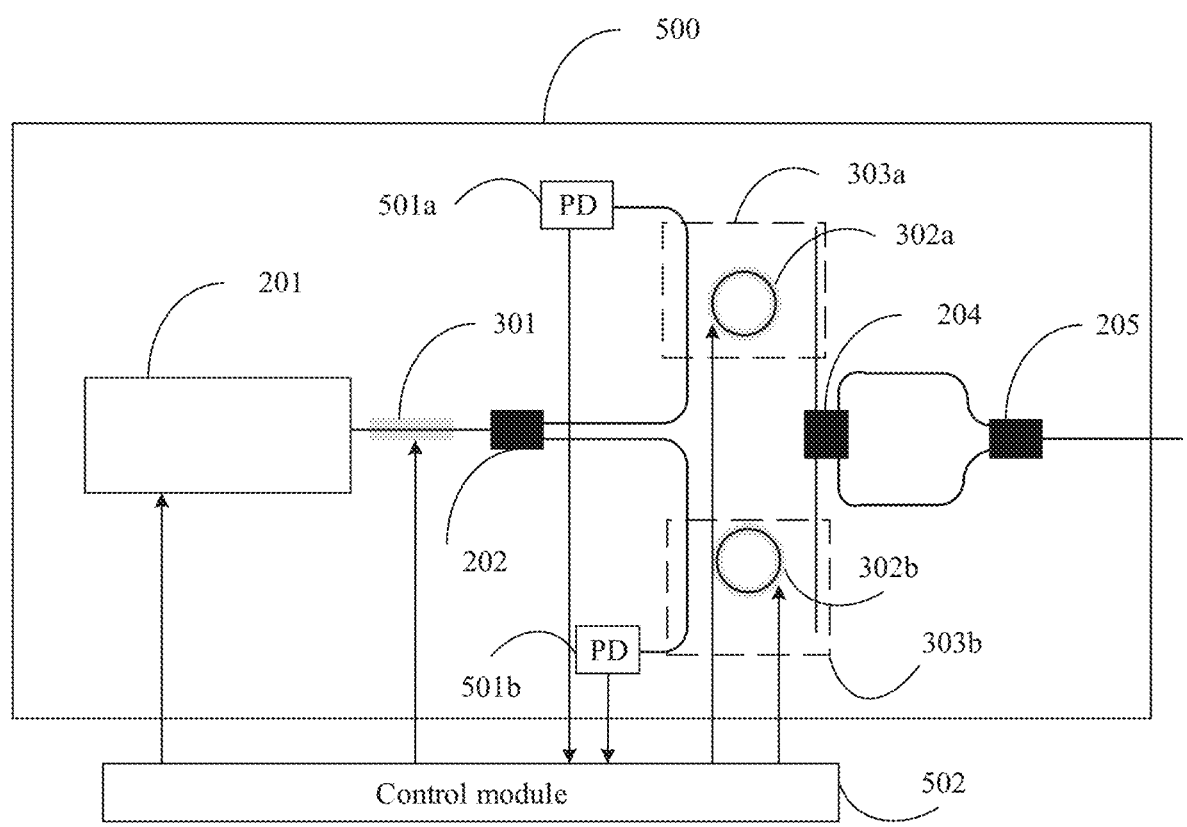
FIG. 5 is a schematic structural diagram of a wavelength tunable laser according to a third embodiment of this application.

FIG. 5 is a schematic structural diagram of a wavelength tunable laser 500 according to a third embodiment of this application. The wavelength tunable laser 500 shown in FIG. 5 includes a reflective SOA 201, three couplers (202, 204, and 205), two microring resonators (303a and 303b), three tuning units (301, 302a, and 302b), and two photodetectors PD) (501a and 501b). Functions and location relationships of the reflective SOA 201, the three couplers (202, 204, and 205), the two microring resonators (303a and 303b), and the three tuning units (301, 302a, and 302b) have been described in FIG. 2 and FIG. 3, and details are not described herein again. Different from the structure of the wavelength tunable laser provided in the first embodiment, in the wavelength tunable laser 500 provided in this embodiment, one port of each of the two microring resonators is connected to one PD. To be specific, an upper port of a left bus waveguide of the microring resonator 303a is connected to the PD 501a, a lower port of a left bus waveguide of the microring resonator 303b is connected to the PD 501b. In addition, output ends of the two PDs are further connected to a control module 502 by using a circuit. The two PDs are configured to obtain monitoring optical power information of microrings connected to the two PDs, to implement alignment between a target wavelength outputted by the wavelength-tunable laser 500 and a resonance wavelength of the microring. This improves output power of the laser and makes the laser work more stably. The following describes a process of adjusting an output wavelength by using a PD. In the following example, an example in which the PD obtains a monitoring current is used for further description.

In this embodiment, ports of the microring resonators connected to the PD 501a and the PD 501b are referred to as straight-through ports for short. Using the microring resonator 303a as an example, when an optical signal that enters the microring resonator from the lower port of the left bus waveguide of the microring resonator is aligned with a current resonance wavelength of the microring, transmittance of the optical signal at the straight-through port is the smallest. Therefore, a current that can be detected by the PD at the straight-through port is the smallest. When the control module applies a small change amount (briefly referred to as a "perturbation signal" below) to the second tuning unit 302a in a specific adjustment manner, for example, thermal adjustment, a relatively small change also occurs in the resonance wavelength of the microring. Correspondingly, a current that can be detected by the PD at the straight-through port also changes with a change of the perturbation signal. Therefore, the control module can precisely adjust the resonance wavelength of each microring resonator based on this association relationship, to implement alignment between the optical signal and the resonance wavelength of the microring, to improve output power of the laser and make the laser work more stably.

Figure 6:
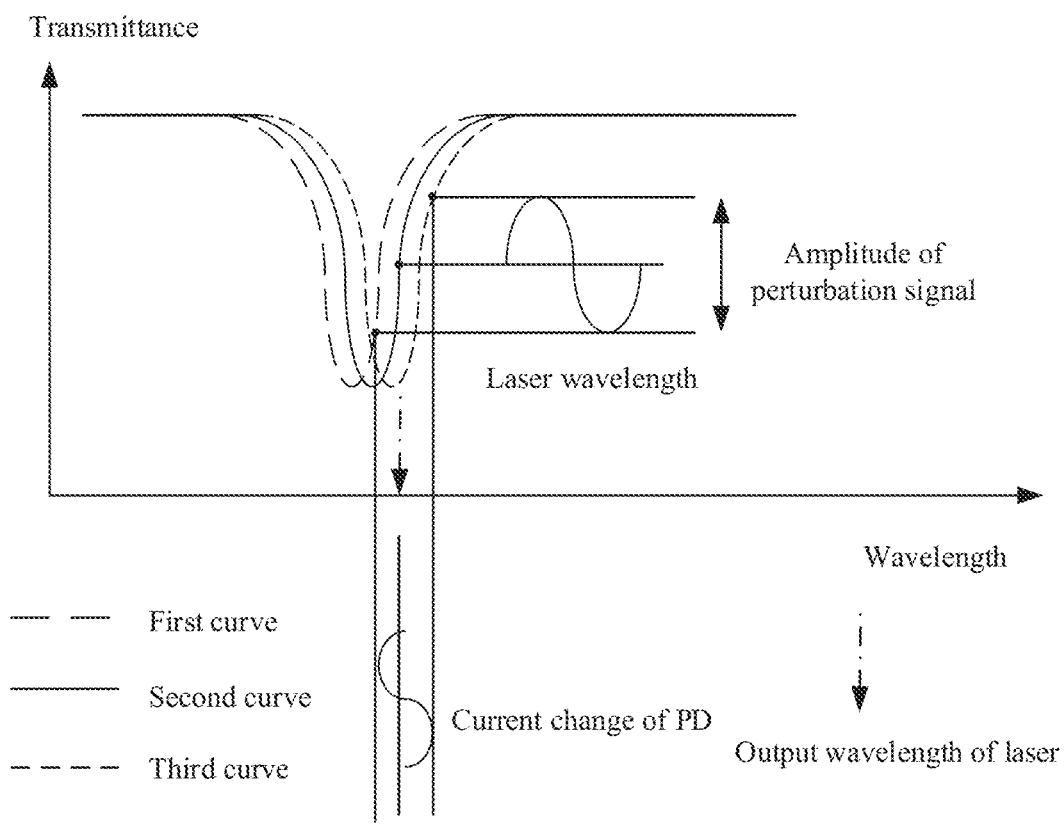
FIG. 6 is a schematic diagram of a relationship between a perturbation signal, transmittance of a straight-through port, and a current detected by a PD (photodetector)

It should be noted that, because adjustment manners used by the control module are different, a change direction of the resonance wavelength of the microring may be different. For example, if the microring is heated by using voltage adjustment in thermal adjustment, a resonance wavelength value of a corresponding microring increases as a voltage increases. For another example, if carrier injection adjustment is used, a corresponding wavelength value decreases as a carrier injection concentration increases. In the following example, thermal adjustment is used as an example for further description. It should be noted that a single microring resonator is used in the following example. A person skilled in the art may know that the following analysis is also applicable to another type of microring resonator or microring resonator group. FIG. 6 is a schematic diagram of a change relationship between a perturbation signal, transmittance of a straight-through port, and a current of a PD. It can be learned from the figure that, transmittance of the straight-through port changes as a voltage applied by the control module changes. It is assumed that a second curve corresponds to a transmittance of the straight-through port when the control module applies a constant voltage value. In this case, a first curve and a third curve correspond to optical signal transmittance of the straight-through port when the control module applies a voltage value that is less than the constant voltage value or a voltage value that is greater than the constant voltage value. It can be learned from FIG. 6 that, a current output by the PD also changes as an amplitude of the perturbation signal changes. As shown in FIG. 6, it is assumed that a current output wavelength of the laser has a small deviation from the resonance wavelength of the microring, that is, the output wavelength of the laser is slightly greater than the resonance wavelength of the microring. In this case, a current amplitude detected by the PD changes reversely as the amplitude of the perturbation signal changes. Therefore, after the control module mixes the current signal obtained from the PD with a disturbance signal applied to the microring, and filters out a high frequency signal, because the current signal of the PD and the disturbance signal are in reverse phases, an obtained error signal is a negative value. Similarly, if the output wavelength of the laser is slightly less than the resonance wavelength of the microring, the error signal obtained by the control module 502 is a positive value. It can be learned from the foregoing description that, a relative relationship between the current output wavelength of the laser and the resonance wavelength of the microring can be determined based on a positive or negative value of the error signal obtained by the control module. Therefore, the control module 502 adjusts the constant voltage applied to the microring, to align the output wavelength of the laser with the resonance wavelength of the microring. For example, in FIG. 6, if the control module 502 determines that the obtained error value is a negative value, it can be determined that the current output wavelength of the laser is greater than the resonance wavelength of the microring resonator. In this case, the two wavelengths may be aligned by increasing the applied constant voltage. In a specific implementation, each microring resonator may be adjusted by using a dichotomy method or in another manner. A specific method is not limited in this application.

Optionally, similar to the second embodiment, in this embodiment, another SOA may be added to increase the output power of the optical signal.

According to the structure of the wavelength tunable laser provided in this embodiment, with a symmetric design, optical signals outputted by the filter region can be effectively aggregated and outputted. The structure is simple, and output efficiency of the optical signals can be improved. In addition, by adding the photodetector, an objective of more accurate dynamic alignment between the output wavelength of the laser and the resonance wavelength of the microring resonator is achieved, so that output power of the optical signal can be further increased, and the laser can work more stably.

Figure 7A:
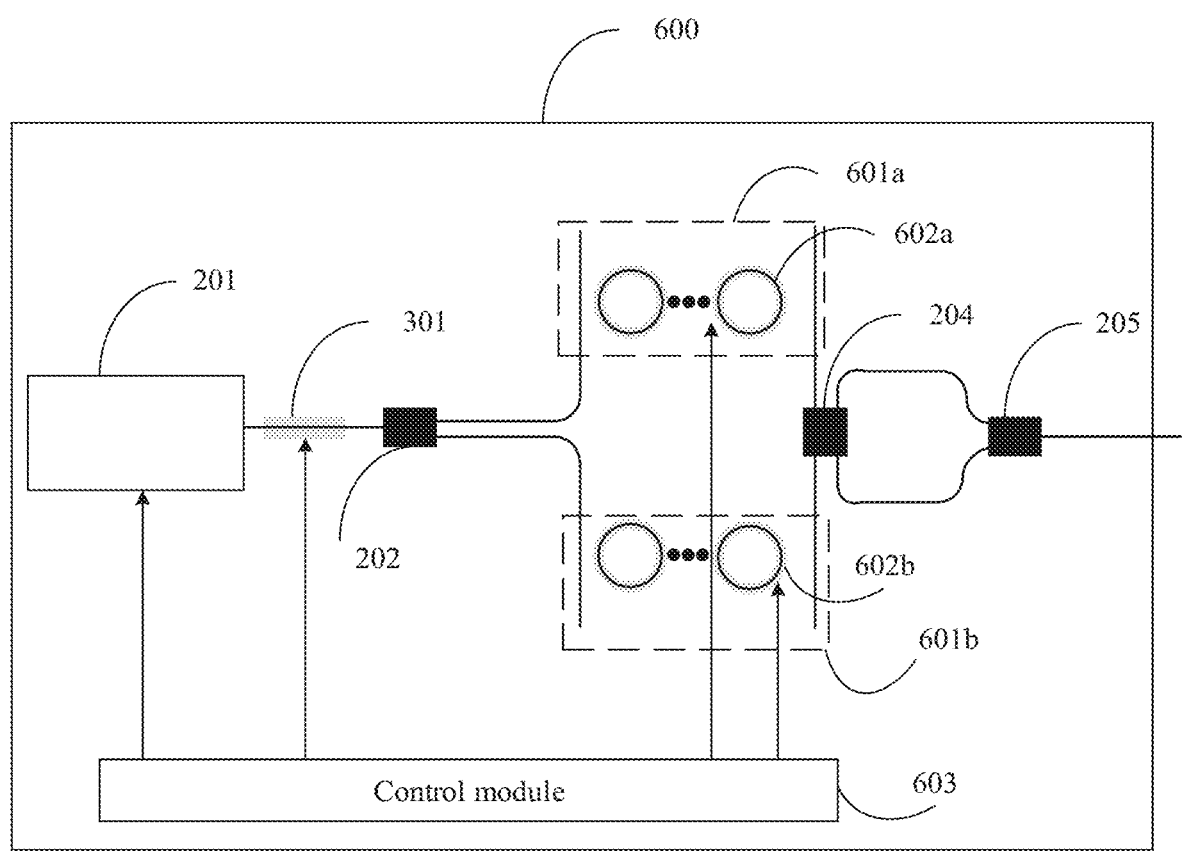
FIG. 7a is a schematic structural diagram of a wavelength tunable laser according to a fourth embodiment of this application.
Figure 7B:
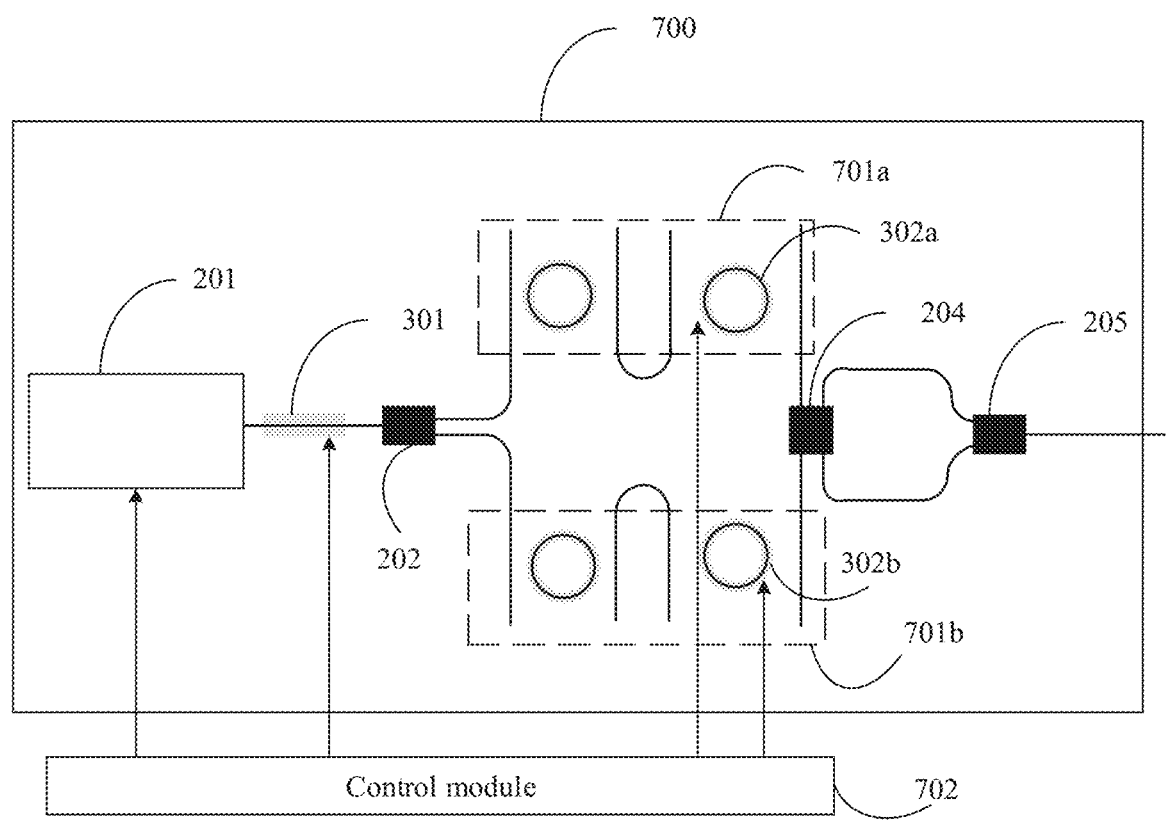
FIG. 7b is a schematic structural diagram of another wavelength tunable laser according to a fourth embodiment of this application.

FIG. 7a and FIG. 7b are schematic structural diagrams of two wavelength tunable lasers 600 and 700 according to a fourth embodiment of this application. The wavelength tunable laser 600 shown in FIG. 7a includes a reflective SOA 201, three couplers (202, 204, and 205), two microring resonators (601a and 601b), a plurality of tuning units (301, 602a and 602b), and a control module 603. Functions and connection manners of the reflective SOA 201, the three couplers (202, 204, and 205), and the plurality of tuning units and the control module 603 are similar to those in FIG. 2 and FIG. 3. Refer to related descriptions. Details are not described herein again. Compared with the first embodiment, the first wavelength tunable laser provided in this embodiment has several differences. First, the wavelength tunable laser includes the control module. A person skilled in the art may know that, optionally, the control module and other parts of the wavelength tunable laser may also be manufactured by two different manufacturers, and then combined for use in practice. Second, the microring resonator in the wavelength tuner is a multi-microring resonator. In other words, one resonator includes a plurality of microrings. Third, because of different types of the microring resonators, a quantity of microrings that need to be controlled by the control module 603 is also different. For example, if one multi-microring resonator includes N microrings, the control module 603 needs to control 2N microrings. It should be noted that the figure does not show numbers of all tuning units of the microring, and only two examples, 602a and 602b, are provided.

The wavelength tunable laser 700 shown in FIG. 7b includes a reflective SOA 201, three couplers (202, 204, and 205), a plurality of microring resonators (701a and 701b), and a plurality of tuning units (301, 302a, and 302b). Functions and connection manners of the reflective SOA 201, the three couplers (202, 204, and 205), and the plurality of tuning units are similar to those in FIG. 3. Refer to related descriptions. Details are not described herein again. A main difference from the first embodiment lies in that, the second wavelength tunable laser provided in this embodiment includes more than two microring resonators. Specifically, 701a represents a microring resonator group. The microring resonator group includes two or more cascaded single microring resonators. Specifically, bus waveguides of the two microring resonators may be connected by using a waveguide shown in FIG. 7b, 701b is similar to 701a, and details are not described herein again. Optionally, the microring resonator group may be any one of: a plurality of cascaded microring resonators, single microring resonators or multi-microring resonators that are cascaded in a hybrid manner, or the like. A type of a specifically included microring resonator is not limited in this application. Correspondingly, the control module 702 needs to control a plurality of microrings. Only tuning units of two microring resonators in the cascaded microring resonators, that is, 302a and 302b, are shown in the figure.

Optionally, the wavelength tunable laser shown in FIG. 7a may further include the PD structure shown in FIG. 5, to implement alignment between an output wavelength of the laser and a microring resonance wavelength. Specifically, for a structure in FIG. 7a, the PDs may be directly connected to upper ports of left bus waveguides of two multi-microring resonators. Optionally, for a structure in FIG. 7b, the PD may be directly connected to an upper port of a left bus waveguide of each microring resonator in a first resonator group of the plurality of microring resonators, and a lower port of a left waveguide of each microring resonator in a second resonator group of the plurality of microring resonators. It should be noted that a principle of alignment is similar to the description in FIG. 5, and details are not described herein again.

Optionally, similar to the second embodiment, one SOA may be added to each of the two wavelength tunable lasers in this application, to increase output optical power.

According to the structure of the wavelength tunable laser provided in this embodiment, with a symmetric design, optical signals outputted by the filter region can be effectively aggregated and output. The structure is simple, and output efficiency of the optical signals can be improved.

Figure 8:
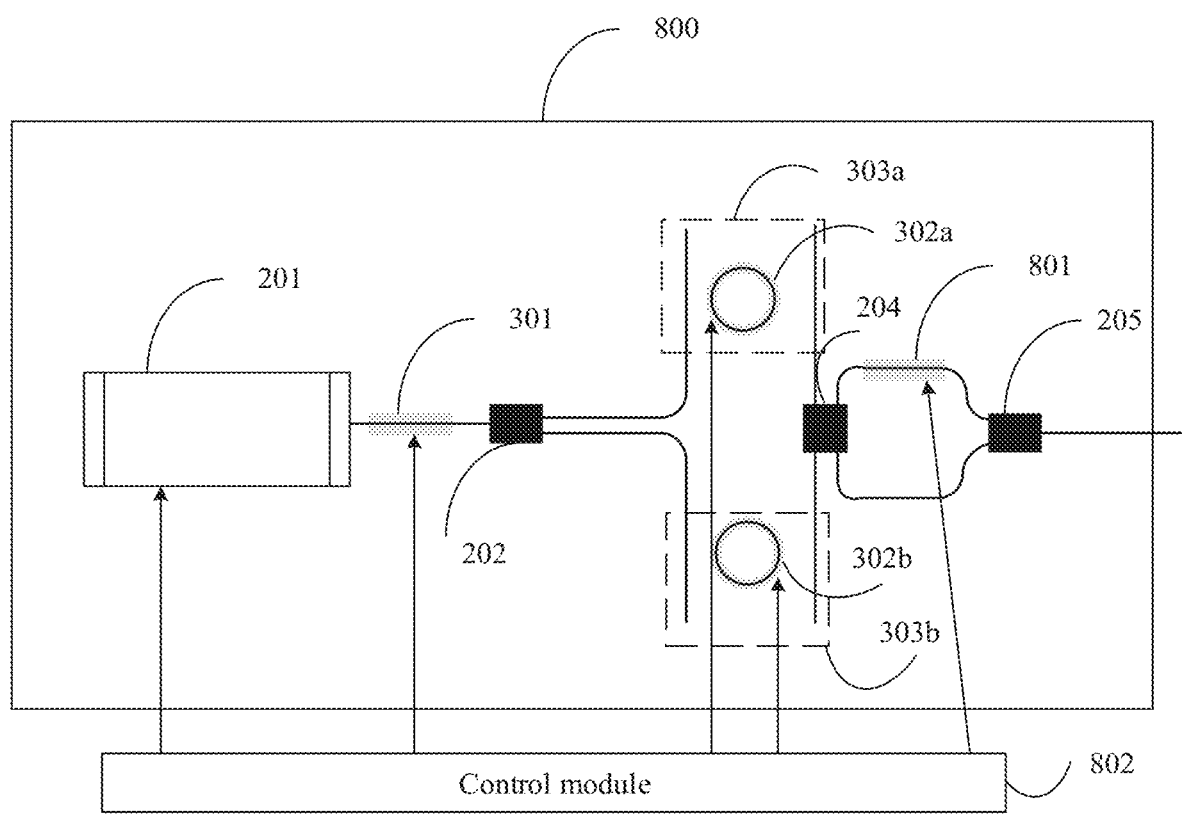
FIG. 8 is a schematic structural diagram of a wavelength tunable laser according to a fifth embodiment of this application.

FIG. 8 is a schematic structural diagram of a wavelength tunable laser 800 according to a fifth embodiment of this application. The wavelength tunable laser 800 shown in FIG. 8 includes a reflective SOA 201, three couplers (202, 204, and 205), and two microring resonators (303a and 303b). For functions and connection relationships of these components, refer to descriptions of related components in FIG. 2 and FIG. 3. Details are not described herein again. It should be noted that the microring structure in this embodiment may be replaced by a microring structure mentioned in another embodiment. The wavelength tunable laser 800 in this embodiment further includes a first refractive index tuning unit 301, a second refractive index tuning unit 302a, a third refractive index tuning unit 302b, and a fourth refractive index tuning unit 801. For descriptions of the first three tuning units, refer to related descriptions in the first embodiment. Details are not described herein again. A main difference between this embodiment and the first embodiment lies in that this embodiment further includes the fourth refractive index tuning unit 801. The tuning unit is configured to adjust an optical field phase of an optical signal that passes through the unit. In an actual laser fabrication process, a phase of an optical signal outputted by the microring resonator 303a to the coupler 204 may be different from a phase of an optical signal outputted by the microring resonator 303b to the coupler 204. There may be an energy loss when optical signals with different phases are subsequently coupled. To prevent this problem, a phase adjustment region (namely, the fourth refractive index tuning unit 801) may be added to make phases of optical signals input to the coupler 205 the same, thereby increasing output power. It should be noted that a location of the fourth refractive index tuning unit 801 is not limited to the example shown in FIG. 8, and the fourth refractive index tuning unit 801 may alternatively be located on the other port that is of the coupler 204 and that is connected to the coupler 205.

Optionally, similar to the second embodiment, one SOA may be added to the two wavelength tunable lasers in this application, to increase output optical power.

Optionally, the wavelength tunable laser shown in FIG. 8 may further include the PD structure shown in FIG. 5, to implement alignment between an output wavelength of the laser and a microring resonance wavelength.

According to the structure of the wavelength tunable laser provided in this embodiment, with a symmetric design, optical signals outputted by the filter region can be effectively aggregated and output. The structure is simple, and output efficiency of the optical signals can be improved. In addition, by adding the phase adjustment region, an error introduced by a process design is avoided, and output power of an optical signal is further increased.

A person of ordinary skill in the art may understand that the control module in the foregoing embodiments may be implemented by hardware or a program instructing related hardware. The program may be stored in a computer-readable storage medium. The storage medium may be a read-only memory, a random access memory, or the like. Specifically, for example, the foregoing processor may be a central processing unit, a general-purpose processor, a digital signal processor (DSP), an application-specific integrated circuit (ASIC), a field programmable gate array (FPGA) or another programmable logic device, a transistor logic device, a hardware component, or any combination thereof. Whether the functions of the control module are performed by hardware or software depends on specific applications and design constraint conditions of technical solutions. A person skilled in the art may use different methods to implement the described functions for each particular application, but the implementation shall not be construed as beyond the scope of this application.

When the control module is implemented by software, the method steps in the foregoing embodiments may be implemented completely or partially in a form of a computer program product. The computer program product includes one or more computer instructions. When the computer program instructions are loaded and executed on the computer, the procedure or functions according to the embodiments of this application are all or partially generated. The computer ay be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

Finally, it should be noted that the foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A wavelength tunable laser, wherein the wavelength tunable laser comprises a reflective semiconductor optical amplifier, three couplers, and at least two microring resonators, and wherein:

the three couplers comprise a first coupler, a second coupler, and a third coupler, wherein the first coupler comprises a first port, a second port, and a third port, wherein the second coupler comprises a first port, a second port, a third port, and a fourth port, and wherein the third coupler comprises three ports;

the reflective semiconductor optical amplifier is connected to the first port of the first coupler, wherein one or more of the at least two microring resonators are arranged between the second port of the first coupler and the first port of the second coupler, wherein the others of the at least two microring resonators are arranged between the third port of the first coupler and the second port of the second coupler, and wherein the third port and the fourth port of the second coupler are connected to two ports of the third coupler; and wherein one port of each of the at least two microring resonators is connected to one of a plurality of photodetectors, and the plurality of photodetectors are configured to obtain optical power information of each of the at least two microring resonators, to implement dynamic alignment between a target wavelength output by the wavelength tunable laser and a resonance wavelength of the at least two microring resonators; and wherein the wavelength tunable laser further comprises a first refractive index tuning unit, and wherein the first refractive index tuning unit is located between the third port of the second coupler and a port of the third coupler that is connected to the third port of the second coupler, or the first refractive index tuning unit is located between the fourth port of the second coupler and a port of the third coupler that is connected to the fourth port of the second coupler.

2. The wavelength tunable laser according to claim 1, wherein coupling coefficients of the first coupler and the third coupler are the same.

3. The wavelength tunable laser according to claim 1, wherein that one or more of the at least two microring resonators are arranged between the second port of the first coupler and the first port of the second coupler, and the others of the at least two microring resonators are arranged between the third port of the first coupler and the second port of the second coupler comprises the following:

the at least two microring resonators comprise a first microring resonator and a second microring resonator;

the second port of the first coupler is connected to one waveguide of the first microring resonator, wherein the first port of the second coupler is connected to another waveguide of the first microring resonator; and the third port of the first coupler is connected to one waveguide of the second microring resonator, wherein the second port of the second coupler is connected to another waveguide of the second microring resonator.

4. The wavelength tunable laser according to claim 2, wherein that one or more of the at least two microring resonators are arranged between the second port of the first coupler and the first port of the second coupler, and the others of the at least two microring resonators are arranged between the third port of the first coupler and the second port of the second coupler comprises the following:

the at least two microring resonators comprise a first microring resonator and a second microring resonator;

the second port of the first coupler is connected to one waveguide of the first microring resonator, wherein the first port of the second coupler is connected to another waveguide of the first microring resonator; and the third port of the first coupler is connected to one waveguide of the second microring resonator, wherein the second port of the second coupler is connected to another waveguide of the second microring resonator.

5. The wavelength tunable laser according to claim 3, wherein any one of the first microring resonator and the second microring resonator comprises one or more microrings.

6. The wavelength tunable laser according to claim 1, wherein that one or more of the at least two microring resonators are arranged between the second port of the first coupler and the first port of the second coupler, and the others of the at least two microring resonators are arranged between the third port of the first coupler and the second port of the second coupler comprises the following:

the at least two microring resonators comprise a first microring resonator, a second microring resonator, a third microring resonator, and a fourth microring resonator;

the second port of the first coupler is connected to one waveguide of the first microring resonator, wherein the first port of the second coupler is connected to one waveguide of the second microring resonator; and the third port of the first coupler is connected to one waveguide of the third microring resonator, wherein the second port of the second coupler is connected to one waveguide of the fourth microring resonator.

7. The wavelength tunable laser according to claim 6, wherein the first microring resonator is connected to the second microring resonator, and wherein the third microring resonator is connected to the fourth microring resonator.

8. The wavelength tunable laser according to claim 6, wherein one or more microring resonators are arranged between the first microring resonator and the second microring resonator or between the third microring resonator and the fourth microring resonator.

9. The wavelength tunable laser according to claim 6, wherein any one of the first microring resonator, the second microring resonator, the third microring resonator, and the fourth microring resonator comprises one or more microrings.

10. The wavelength tunable laser according to claim 1, wherein another port of the third coupler is connected to another semiconductor optical amplifier.

11. The wavelength tunable laser according to claim 10, wherein both end faces of the another semiconductor optical amplifier are plated with antireflective coatings.

12. The wavelength tunable laser according to claim 1, wherein the wavelength tunable laser further comprises a second refractive index tuning unit located between the reflective semiconductor optical amplifier and the first coupler, and wherein the at least two microring resonators each are provided with a third refractive index tuning unit.

13. The wavelength tunable laser according to claim 12, wherein an adjustment manner of the first refractive index tuning unit, the second refractive index tuning unit, and the third refractive index tuning unit is any one of thermal adjustment, carrier injection adjustment, or piezo-optic effect adjustment.

14. The wavelength tunable laser according to claim 12, wherein the wavelength tunable laser further comprises a wavelength tuning control circuit, and wherein the wavelength tuning control circuit is configured to control a current of the reflective semiconductor optical amplifier, the first refractive index tuning unit, the second refractive index tuning unit, and the third refractive index tuning unit.

15. The wavelength tunable laser according to claim 13, wherein the wavelength tunable laser further comprises a wavelength tuning control circuit, and wherein the wavelength tuning control circuit is configured to control a current of the reflective semiconductor optical amplifier, the first refractive index tuning unit, the second refractive index tuning unit, and the third refractive index tuning unit.

16. The wavelength tunable laser according to claim 3, wherein the three couplers, the at least two microring resonators, and waveguides of the at least two microring resonators comprise any one of the following four materials: silicon, silicon nitride, silicon dioxide, or a polymer material.

17. The wavelength tunable laser according to claim 1, wherein both the first coupler and the third coupler are of a Y-shaped structure or a multi-mode interferometer structure, and wherein the second coupler is of a directional coupler structure or a multi-mode interferometer structure.

* * * * *

UNITED STATES PATENT AND TRADEMARK OFFICE
CERTIFICATE OF CORRECTION

| | | |
|---|---|---|
| PATENT NO. | : 12,107,392 B2 | Page 1 of 1 |
| APPLICATION NO. | : 17/063917 | |
| DATED | : October 1, 2024 | |
| INVENTOR(S) | : Jialin Zhao, Wei Chen and Xiaolu Song | |

It is certified that error appears in the above-identified patent and that said Letters Patent is hereby corrected as shown below:

In the Specification

In Column 1, In Line 7 (Approx.), Delete "Filed" and insert -- filed --.

Signed and Sealed this
Twenty-eighth Day of January, 2025

Coke Morgan Stewart
*Acting Director of the United States Patent and Trademark Office*